(12) United States Patent
Guenard

(10) Patent No.: US 9,478,707 B2
(45) Date of Patent: Oct. 25, 2016

(54) METHOD OF MANUFACTURING STRUCTURES OF LEDS OR SOLAR CELLS

(71) Applicant: Soitec, Bernin (FR)

(72) Inventor: Pascal Guenard, Froges (FR)

(73) Assignee: Soitec, Bernin (FR)

(*) Notice: Subject to any disclaimer, the term of this patent is extended or adjusted under 35 U.S.C. 154(b) by 0 days.

(21) Appl. No.: 14/405,632

(22) PCT Filed: Jun. 14, 2013

(86) PCT No.: PCT/EP2013/062423
§ 371 (c)(1),
(2) Date: Dec. 4, 2014

(87) PCT Pub. No.: WO2013/189857
PCT Pub. Date: Dec. 27, 2013

(65) Prior Publication Data
US 2015/0115290 A1    Apr. 30, 2015

(30) Foreign Application Priority Data

Jun. 22, 2012  (FR) ........................ 12 55931
Jun. 22, 2012  (FR) ........................ 12 55934
Aug. 6, 2012   (FR) ........................ 12 57617

(51) Int. Cl.
H01L 33/32    (2010.01)
H01L 31/02    (2006.01)
(Continued)

(52) U.S. Cl.
CPC ............. *H01L 33/32* (2013.01); *H01L 27/142* (2013.01); *H01L 27/153* (2013.01);
(Continued)

(58) Field of Classification Search
CPC ............... H01L 33/32; H01L 33/0075; H01L 33/0079; H01L 31/1892
USPC ..................................................... 438/66, 28
See application file for complete search history.

(56) References Cited

U.S. PATENT DOCUMENTS 3,921,885 A * 11/1975 Knox ................. B23K 20/16
                                                228/116
6,037,644 A *  3/2000 Daghighian ........ H01L 31/1016
                                                257/431
(Continued)

FOREIGN PATENT DOCUMENTS

EP          2390933 A1   11/2011
KR     1020110058122 A    6/2011
(Continued)

OTHER PUBLICATIONS

International Search Report for International Application No. PCT/EP2013/062423 dated Sep. 26, 2013, 4 pages.
(Continued)

*Primary Examiner* — Tan N Tran
(74) *Attorney, Agent, or Firm* — TraskBritt

(57) ABSTRACT

The disclosure relates to a manufacturing method comprising the formation of elemental LED or photovoltaic structures on a first substrate, each comprising at least one p-type layer, an active zone and an n-type layer, formation of a first planar metal layer on the elemental structures, provision of a transfer substrate comprising a second planar metal layer, assembly of the elemental structures with the transfer substrate by bonding of the first and second metal layers by molecular adhesion at room temperature, and removal of the first substrate.

14 Claims, 13 Drawing Sheets

(51) Int. Cl.
   *H01L 31/075* (2012.01)
   *H01L 31/18* (2006.01)
   *H01L 33/00* (2010.01)
   *H01L 27/142* (2014.01)
   *H01L 27/15* (2006.01)
   *H01L 31/0304* (2006.01)
   *H01L 33/44* (2010.01)
   *H01L 33/20* (2010.01)

(52) U.S. Cl.
   CPC .. *H01L 31/02008* (2013.01); *H01L 31/03044* (2013.01); *H01L 31/075* (2013.01); *H01L 31/1844* (2013.01); *H01L 31/1892* (2013.01); *H01L 33/007* (2013.01); *H01L 33/0075* (2013.01); *H01L 33/0079* (2013.01); *H01L 33/44* (2013.01); *H01L 27/156* (2013.01); *H01L 33/20* (2013.01); *H01L 2224/18* (2013.01); *H01L 2933/0016* (2013.01); *Y02E 10/548* (2013.01)

(56) References Cited

U.S. PATENT DOCUMENTS

| | | | |
|---|---|---|---|
| 6,281,524 | B1 | 8/2001 | Yamamoto et al. |
| 6,921,741 | B2 * | 7/2005 | Arendt .................. C23C 14/081 428/701 |
| 2005/0280007 | A1 | 12/2005 | Hsu et al. |
| 2006/0043384 | A1 | 3/2006 | Cho et al. |
| 2006/0169994 | A1 | 8/2006 | Tu et al. |
| 2008/0179602 | A1 | 7/2008 | Negley et al. |
| 2009/0032970 | A1 * | 2/2009 | Park ........................ H01L 24/81 257/777 |
| 2010/0006881 | A1 | 1/2010 | Seo et al. |
| 2010/0019222 | A1 | 1/2010 | Yan et al. |
| 2010/0022039 | A1 * | 1/2010 | Chang ................. H01L 33/0095 438/28 |
| 2010/0308455 | A1 | 12/2010 | Kim et al. |
| 2011/0174376 | A1 | 7/2011 | Lochtefeld et al. |
| 2012/0074441 | A1 | 3/2012 | Seo et al. |
| 2012/0126259 | A1 * | 5/2012 | Mizutani ................ H01L 27/156 257/88 |
| 2012/0220063 | A1 | 8/2012 | Seong |
| 2015/0171273 | A1 * | 6/2015 | Balkenende ........ H01L 21/0237 257/79 |

FOREIGN PATENT DOCUMENTS

| | | |
|---|---|---|
| TW | 201138168 A | 11/2011 |
| WO | 2012066033 A1 | 5/2012 |

OTHER PUBLICATIONS

Taiwan Search Report for Taiwan Application No. 102122243 dated Dec. 25, 2014, 1 page.
International Written Opinion for International Application No. PCT/EP2013/062423 dated Sep. 26, 2013, 4 pages.
International Preliminary Report on Patentability for International Application No. PCT/EP2013/062423 dated Dec. 23, 2014, 5 pages.
European Communication pursuant to Article 94(3) EPC for European Application No. EP 13 729 948.3 dated Feb. 2, 2016, 7 pages.

* cited by examiner

METHOD OF MANUFACTURING STRUCTURES OF LEDS OR SOLAR CELLS

CROSS-REFERENCE TO RELATED APPLICATIONS

This application is a national phase entry under 35 U.S.C. §371 of International Patent Application PCT/EP2013/062423, filed Jun. 14, 2013, designating the United States of America and published in English as International Patent Publication WO 2013/189857 A1 on Dec. 27, 2013, which claims the benefit under Article 8 of the Patent Cooperation Treaty and under 35 U.S.C. §119(e) to French Patent Application Ser. No. 1257617, filed Aug. 6, 2012, French Patent Application Ser. No. 1255931, filed Jun. 22, 2012, and French Patent Application Ser. No. 1255934, filed Jun. 22, 2012, the disclosure of each of which is hereby incorporated herein in its entirety by this reference.

TECHNICAL FIELD

The disclosure relates to the manufacture of light-emitting diodes (LEDs) and those of solar (photovoltaic) cells.

BACKGROUND

LEDs are generally manufactured from elemental structures corresponding to a stack of layers comprising at least one n-type layer or region, one p-type layer or region and an active layer disposed between the n-type and p-type layers.

As for solar cells, they are manufactured from elemental structures comprising at least one p-n junction (junction of a p-type layer and an n-type layer). These elemental structures can include a plurality of p-n junctions. As is well-known to those skilled in the art, a p-n junction contains an active zone corresponding to the space charge region (SCR) located around the junction.

The elemental structures mentioned above can be formed from the same growth substrate on which a stack of the necessary layers is formed by epitaxial growth, portions of this stack then being cut out of the substrate to insulate the elemental LED or photovoltaic structure.

However, other LED or solar cell manufacturing operations, such as wiring by the formation of n and p contact pads, or disassembly/removal of the growth support notably required to carry out subsequent treatments, are carried out all or in part on the level of each elemental structure individually, meaning that the elemental structures are separate from each other and that one structure is thus treated at a time.

The same is true for operations involved in the assembly of LEDs or solar cells on a mechanical support or for operations of depositing a light-converting material ("phosphorus") carried out individually for each device.

FIG. 1A schematically represents an elemental LED structure 3 obtained after cutting out a growth substrate (sapphire, for example) comprising a plurality of identical LED structures. The elemental LED structure 3 is composed of a stack of an n-type layer 4, an active layer 5 and a p-type layer 6. This elemental LED structure 3 is formed on a growth substrate 2 and further includes, on the upper surface of the p-type layer 6, a reflective layer (mirror) 7, the whole thus forming a multi-layer structure 1.

As is known, the multi-layer structure 1 is then assembled on the exposed surface of the mirror layer 7 with a wafer bonding substrate 8 (FIG. 1B). Traditionally, it is of use to prepare this assembly by thermocompression bonding, this bonding requiring the application of a certain pressure and a particularly high temperature (above 300° C.) in order to guarantee the robustness of the assembly. For example, this bonding can be carried out using a gold-tin alloy enabling soldering between the two surfaces to be bonded.

Once the assembly is complete, the growth substrate 2 (acting as a temporary substrate) is removed from the rest of the multi-layer structure 1, the procedure for such a removal being well-known to the person skilled in the art (FIG. 1C).

The Applicant has, however, observed several major disadvantages related to the thermocompression bonding technique.

The increase in temperature during thermocompression bonding leads to significant thermal expansion of the growth substrate 2, as well as the final substrate 8, this dilation being a function of the respective coefficient of thermal expansion (CTE) of the substrates 2 and 8. To obtain satisfactory bonding results, it is thus necessary to choose the type of substrates 2 and 8 so that they are compatible in terms of CTE with the LED structure 3. A CTE mismatch that is too great is likely to lead to fractures and, consequently, to reduce the manufacturing yields of the structures in question.

The high temperature during bonding further generates deformations of the growth substrate (bowing, warping). This deformation phenomenon is particularly amplified when the growth substrate of the structure to be bonded is large (150 or 200 mm, for example). It is then necessary to apply a greater pressure during assembly in order to limit these deformations. Consequently, the current practice tends to bond each LED structure individually on the final substrate in order to minimize mechanical stress during thermocompression bonding.

These CTE compatibility constraints considerably limit the choice of materials that can form substrates 2 and 8. The choice can, for example, be concerned with germanium, which has the disadvantage, however, of being expensive and relatively unavailable on the materials market.

There is thus a need for a technique for manufacturing structures of LEDs or of solar cells that is effective and notably makes it possible to be freed from the constraints and disadvantages mentioned above.

BRIEF SUMMARY

The disclosure relates to a manufacturing method comprising:

a) formation on a first substrate of a plurality of elemental LED or photovoltaic structures, each comprising at least one p-type layer, an active zone and an n-type layer;

b) formation of a first planar metal layer on the elemental structures;

c) provision of a transfer substrate comprising on one of its surfaces a second planar metal layer;

d) assembly of the elemental structures with the transfer substrate by bonding of the first and second metal layers, bonding being carried out by molecular adhesion at room temperature; and e) removal of the first substrate.

The inventive manufacturing method advantageously makes it possible to be freed from the mechanical stresses resulting from the pressure and temperature conditions needed for traditional thermocompression bonding (as indicated above). The choice of material to use to form the first substrate (support substrate) and the transfer substrate is thus considerably expanded since strict CTE compatibility with the elemental structure is no longer required.

It thus becomes possible to choose, for example, any material to form the support substrate: it can, for example, be a substrate of silicon (widely available and relatively economical in large volumes) or of metal (molybdenum, etc.).

In a particular embodiment, the elemental structures on the first substrate are spaced apart from each other by trenches.

The manufacturing method can further include, between steps a) and b), the deposition of an insulating material in the trenches present between the elemental structures.

Each elemental structure can be formed on an island of relaxed or partially relaxed material, this material being, for example, InGaN.

According to a second embodiment, the method further includes, before step b), the formation of p- or n-type electrical contact pads on the exposed surface of each of the elemental structures.

The method thus makes it possible to form electrical contact pads collectively on all of the elemental structures present on the support substrate. The collective formation provides a considerable improvement in device manufacturing yields.

After the LED or solar cell devices have been manufactured and separated from each other, these pads make it possible to ensure the electrical connection between the elemental structures and the transfer substrate.

According to a third embodiment, steps b) and c) each comprise a respective sub-step of polishing of the first and second metal layers in order to obtain a surface roughness less than or equal to 1 nm RMS, step d) being carried out by bonding by molecular adhesion at room temperature.

Obtaining such a surface quality in advance makes it possible to then carry out bonding by molecular adhesion under favorable conditions.

The method can further comprise, between steps d) and e), a step of annealing at a temperature less than or equal to 100° C. This annealing makes it possible to substantially improve the quality of the bonding by molecular adhesion.

Furthermore, the first and second metal layers can be prepared in a material selected from the group comprising Cu, Al, Ti and W. These two metal layers can be of the same composition or of different compositions.

In a first variant, the elemental structures formed in step a) are photovoltaic structures each comprising at least one p-n junction.

In a second variant, the elemental structures formed in step a) are LED structures in which the active zone is a light-emitting layer.

According to a particular embodiment, the method also comprises, after step e), a step of the cutting out of the transfer substrate in order to separate the elemental structures.

BRIEF DESCRIPTION OF THE FIGURES

Other characteristics and advantages of this disclosure will arise from the description provided below, in reference to the attached drawings, which illustrate an example of an embodiment that should not be considered restrictive. In the figures:

FIGS. 2A to 2I are schematic cross-sectional views showing the manufacture of LED devices in accordance with a first embodiment of the disclosure;

DETAILED DESCRIPTION

The disclosure applies to the manufacture of elemental LED or photovoltaic (i.e., solar cell) structures, each comprising at least one p-type layer, an active zone and an n-type layer.

It will be noted that the examples of implementation of the disclosure described below relate to the manufacture of LED devices. It will be understood, however, that the disclosure applies identically to the manufacture of solar cells, these cells each comprising an elemental photovoltaic structure comprising at least one p-n junction (each p-n junction comprising an active zone as mentioned above).

A method of manufacturing LED devices in accordance with a first embodiment of the disclosure is now described in reference to FIGS. 2A to 2I and 3.

In a first embodiment, the method is implemented from a plate or support substrate 10. The support substrate 10 is sapphire in this example, other materials, however, being possible, notably such as silicon, silicon carbide or germanium.

Figure 1A:
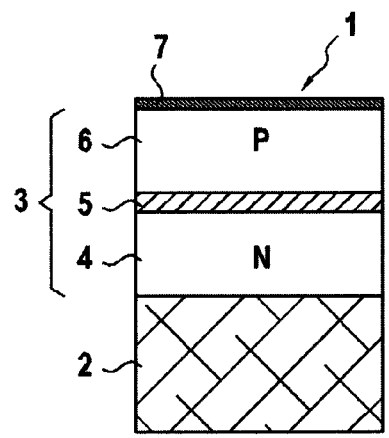
FIGS. 1A to 1C are schematic cross-sectional views showing the principal steps of a known method of manufacturing LED devices.
Figure 1B:
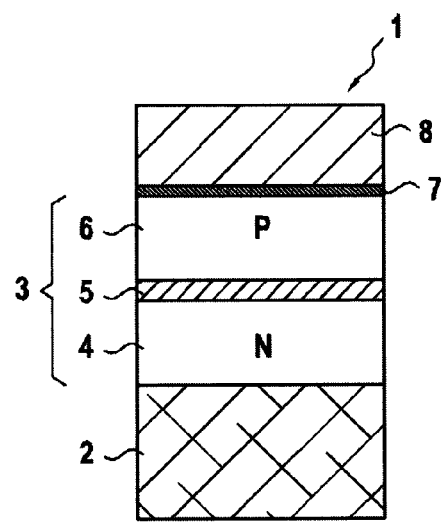
Figure 1C:
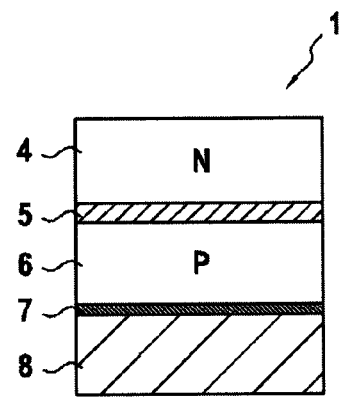
Figure 2A:
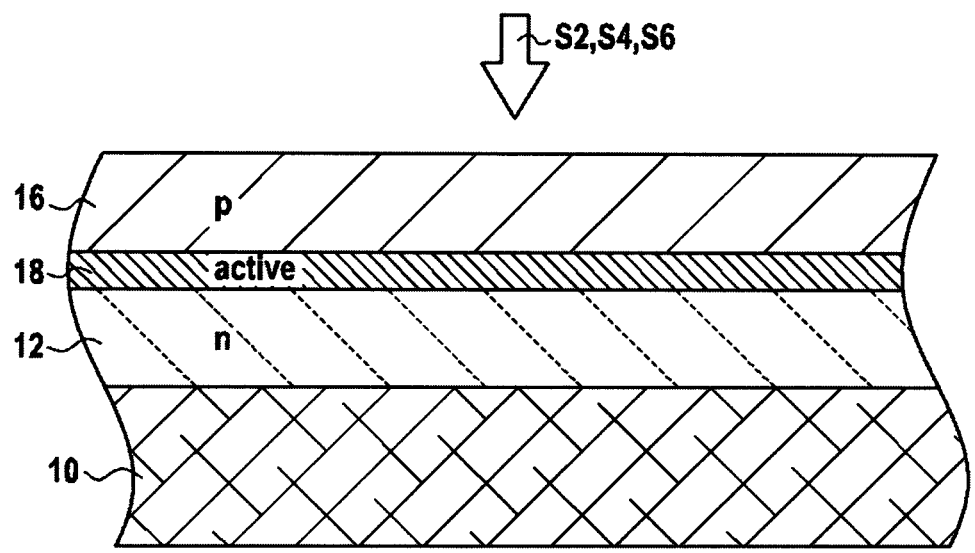

An n-type layer 12 (about 1 or 2 µm in thickness), an active layer 18 (about 10 nm) and a p-type layer 16 (between about 100 nm and 200 nm in thickness) are first deposited successively by epitaxy on the support substrate (10) (respectively, S2, S4 and S6, FIG. 2A). The manner in which these layers are prepared is known to the person skilled in the art and, thus, will not be described in further detail in this document.

The n- and p-type layers can be formed in the reverse order and can include several sub-layers of different compositions, thicknesses or dopant concentrations, comprising unintentionally doped sub-layers.

The active layer 18 is a light-emitting (electroluminescent) layer that can be formed of a single thick or thin layer or of a plurality of layers of light-emitting quantum wells separated from each other by barrier layers.

An etching step (S8, FIG. 2B) is then carried out in order to dispose trenches 19 throughout the thickness of the p-type layer 16 (and, optionally, also in a portion of the thickness of the active layer 18) in order to form p-type islands 20 in layer 16.

At this stage, one then has a structure 28 comprising a plurality of elemental LED structures 25 each comprising a p-type insulated island 20, an active layer 18 and an n-type layer 12. It will be noted that the active layer 18 and the n-type layer 12 are here common to all of the elemental LED structures 25.

As a nonrestrictive example, each p-type island 20 has here a square shape with sides 1 mm in length. The shape and dimensions of the p-type islands 20, which define the shape and at least part of the dimensions of the final LEDs, can obviously be different, with the islands 20 notably being able to have a circular shape.

A layer of insulating material 30, here $SiO_2$, is then deposited by plasma-enhanced chemical vapor deposition (PECVD) in order to cover the exposed surface of the elemental LED structures 25 and trenches 19 (step S10, FIG.

2C). After deposition, this layer of insulating material 30 is planarized by chemical-mechanical polishing (CMP) or by any other suitable polishing technique (chemical etching, etc.) (FIG. 2C). The SiO$_2$ layer 30 can also be formed by the well-known spin-on glass (SOG) technique, which consists of depositing, on the substrate in rotation on a spinner, a viscous SiO$_2$ precursor composition. With this deposition technique, the SiO$_2$ layer has a satisfactory surface quality that does not require a post-deposition polishing step.

Figure 2B:
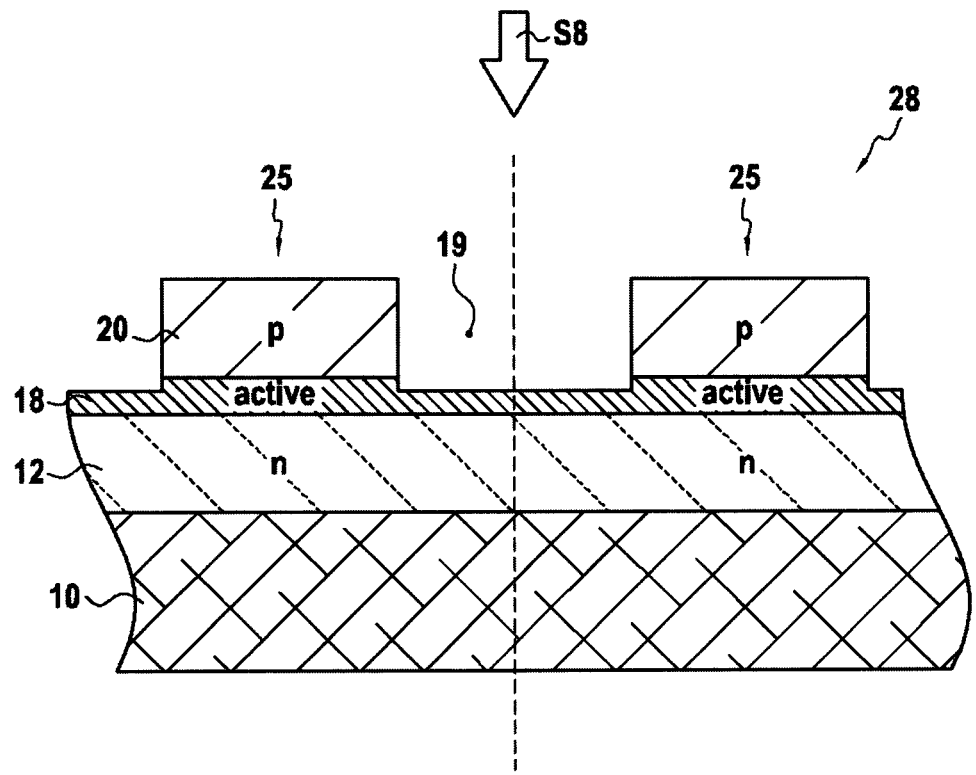
Figure 2C:
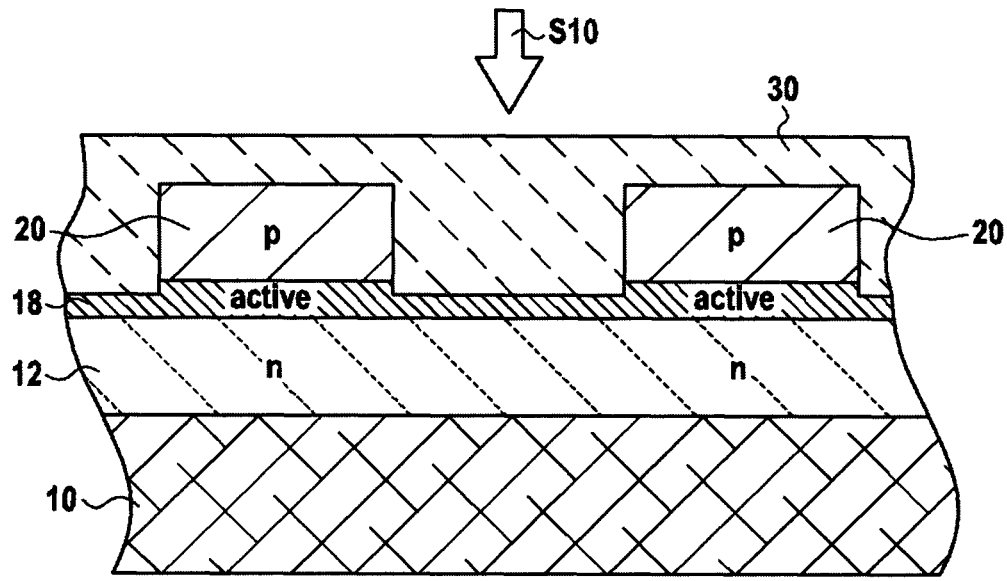
Figure 2D:
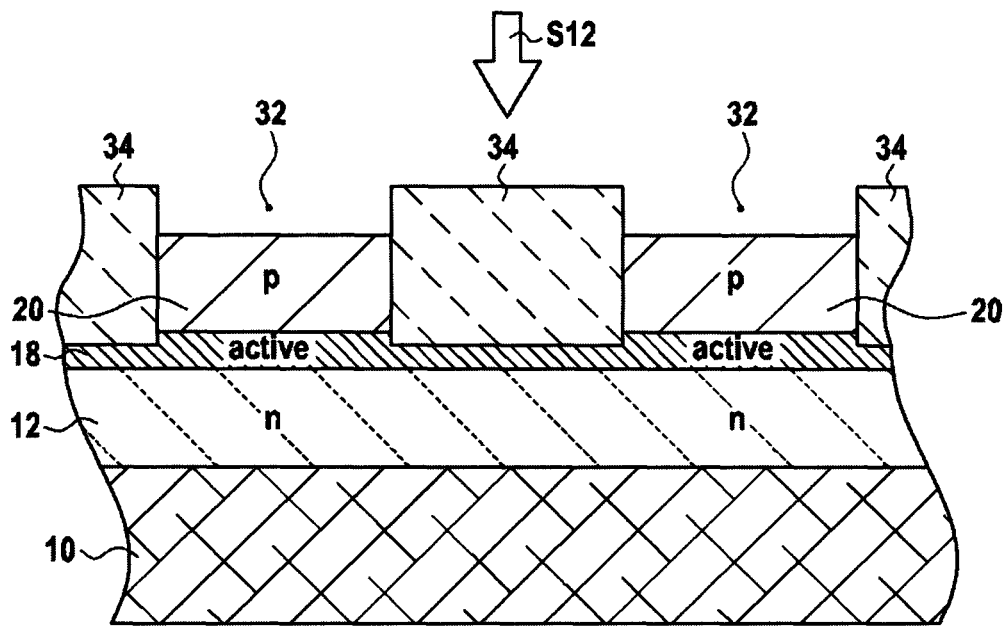

The insulating layer 30 is then opened, for example, by dry or wet selective chemical etching, on top of each p-type island 20 (step S12, FIG. 2D). At the conclusion of this etching step S12, the openings 32 thus made are delimited by the residual portion 34 of the insulating layer 30. To this end, use is made of an etching mask comprising a protective resin layer with openings (resin-free zones) delimiting the zones to be etched in the structure.

Figure 2E:
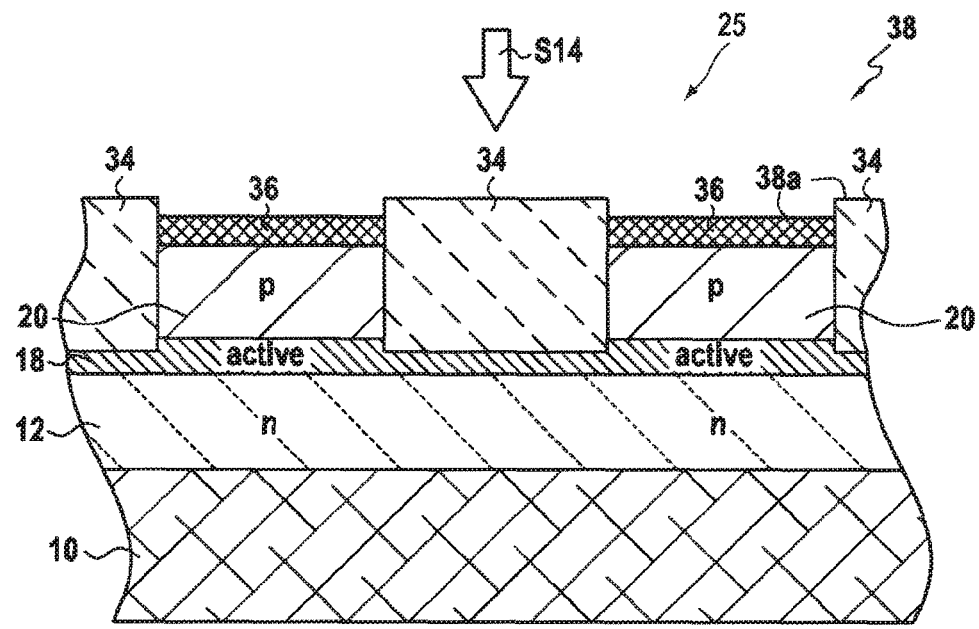

The p contact pads 36 are then formed in the openings 32 by deposition in the latter of at least one conductive material (step S14, FIG. 2E). During deposition of the contact pad 36 materials, the mask used is preserved for etching the openings 32. Once the p contact pads 36 are formed, the protective resin of the etching mask is removed, which makes it possible to remove at the same time the constitutive materials of the p contact pads 36 deposited beyond the openings 32.

The method thus makes it possible to form electrical contact pads collectively on the whole of the elemental structures 25 present on the support substrate 10. The collective formation provides a considerable improvement in device manufacturing yields.

The layer forming the p contact pads 36 can notably include:
- a metal such as Ni, Pd or Pt with a thickness between 1 Å and 5 nm, in order to obtain a good resistivity and a good ohmic character,
- a reflector, for example, in the form of a layer of Ag with a thickness of about 100 nm, in order to return to the emitting surface the photons leaving toward the opposite surface (i.e., those moving toward the p-type layer when the structure is transferred to the final substrate, the emitting surface thus being found on the side of the n-type layer 12), and
- a diffusion barrier, for example, in the form of a layer of WN or TiN with a thickness between 20 and 50 nm.

At this stage of the manufacturing process, one has a structure 38 in the form of a plate with a plurality of elemental structures 25, each provided with a p contact pad 36.

Figure 2F:
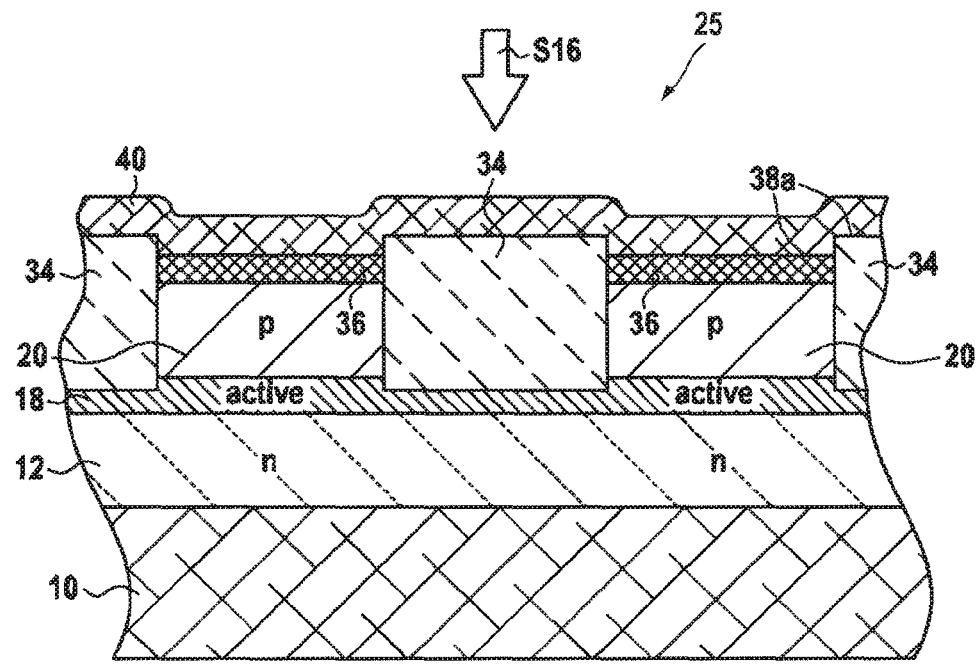

Next is the formation, on the whole of the upper surface 38a of structure 38, of a metal layer 40 in order to cover the elemental structures 25 as well as the insulating portions 34 (step S16, FIG. 2F). The metal layer 40 is prepared, for example, by plasma-enhanced chemical vapor deposition (PECVD) or any other technique known to the person skilled in the art adapted to the formation of thin layers (SOG technique, etc.). The metal deposition can, for example, be carried out completely by PVD (in the case of a metal layer 40 of aluminum, for example) or CVD, optionally followed by an electrodeposition phase. The deposition technique used depends on the metals constituting layer 40.

As shown in FIG. 2F, the metal layer 40 thus deposited follows to a certain extent the form of the underlying topography, in particular, the contours formed by the insulating portions 34 in relation to the p contact pads 36. In this example, the insulating portions 34 form "steps" about 1 µm in height in relation to the adjacent p islands 20. The thickness of the metal layer 40 is selected in order to then be able to be planarized adequately during step S18 to follow (see below). In this example, the thickness of the metal layer is about 3 µm.

It should be noted that the metal layer 40 can include a plurality of conductive sub-layers or can be composed of a single layer of conductive material. The metal layer 40 can include, for example, at least one sub-layer composed of one of the following conductive materials (or a combination of at least two): copper, aluminum, titanium and tungsten. Alternatively, the metal layer 40 is composed of a single layer formed, for example, of one of the materials mentioned above.

Figure 2G:
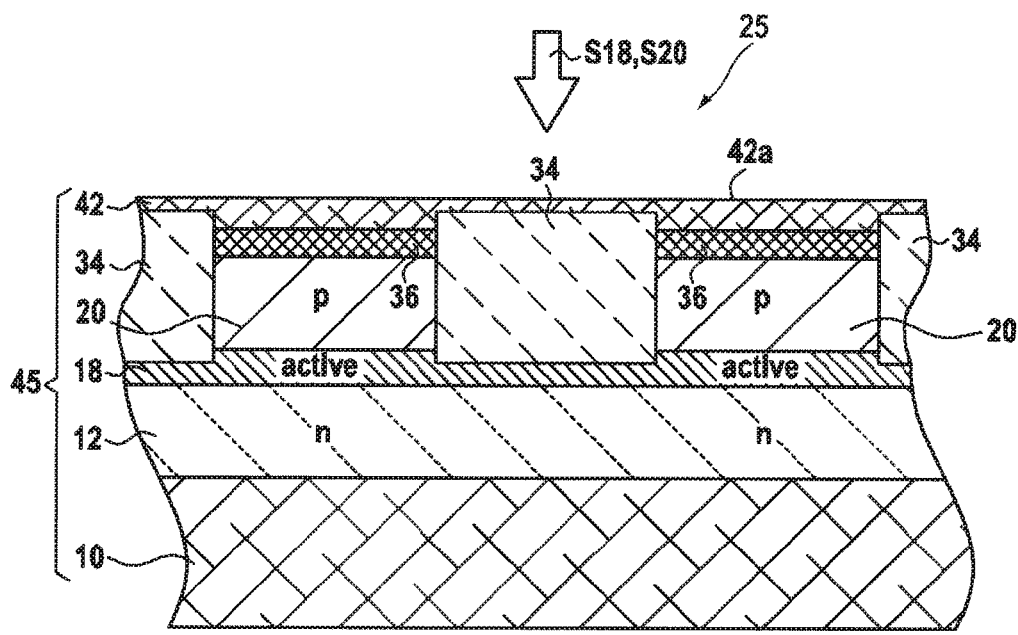

The metal layer 40 is then prepared by chemical-mechanical polishing (CMP) so that an upper surface 42a of the residual metal layer 42 has a sufficient planarity to enable subsequent bonding (step S18, FIG. 2G). This polishing makes it possible, for example, to obtain a surface roughness 42a less than or equal to 1 nm RMS, and preferably less than or equal to 0.5 nm RMS (it should be noted that the roughness values in RMS given in the disclosure correspond to a surface of 1 µm×1 µm). As indicated below, the required roughness depends, in particular, on the bonding technique to be used during the bonding step S22 to come (see below).

In this example, polishing S18 is followed by a step of cleaning of the upper surface 42a of the metal layer 42 in order to eliminate the particles resulting from the polishing step S18 (step S20, FIG. 2G).

Cleaning S20 must be carried out in such a way as not to alter the roughness of the exposed surface 42a obtained beforehand at the conclusion of the polishing step S18. Furthermore, this cleaning step S20 must make it possible to remove a maximum of the residues that can result from the polishing S18 of the exposed surface 42a.

At this stage of the process, a structure 45 is obtained in the form of a plate with a plurality of elemental LED structures 25, each provided with a p contact pad, these structures 25 being covered with a planar metal layer 42. The roughness required for the metal layer 42 can nevertheless vary somewhat according to the bonding technique to be employed in the bonding step S22 to come (see below).

It should be noted that as a variant, it is possible to carry out a first step of chemical-mechanical polishing (CMP) of the exposed surface 38a of the structure 38 before proceeding to the deposition S16 of the metal layer 40. After this metal deposition, a second chemical-mechanical polishing is carried out as indicated in step S18 in order to adequately planarize the exposed surface of the metal layer 40. This variant makes it possible to substantially save the quantity of metal to be deposited to form the metal layer 40 (the contours underlying the metal layer 40 being removed during the first polishing step). Such savings are particularly advantageous when the metal used is expensive (the case for gold, for example). On the other hand, this variant involves an additional polishing step that also has an impact in terms of cost and productivity.

Figure 2H:
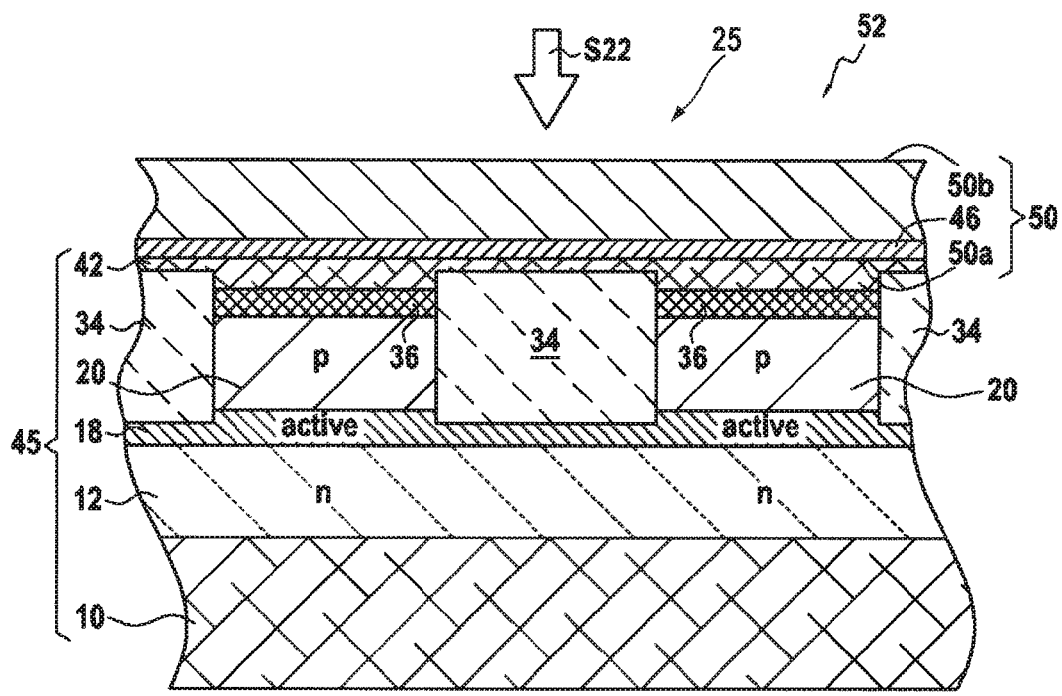
Figure 21:
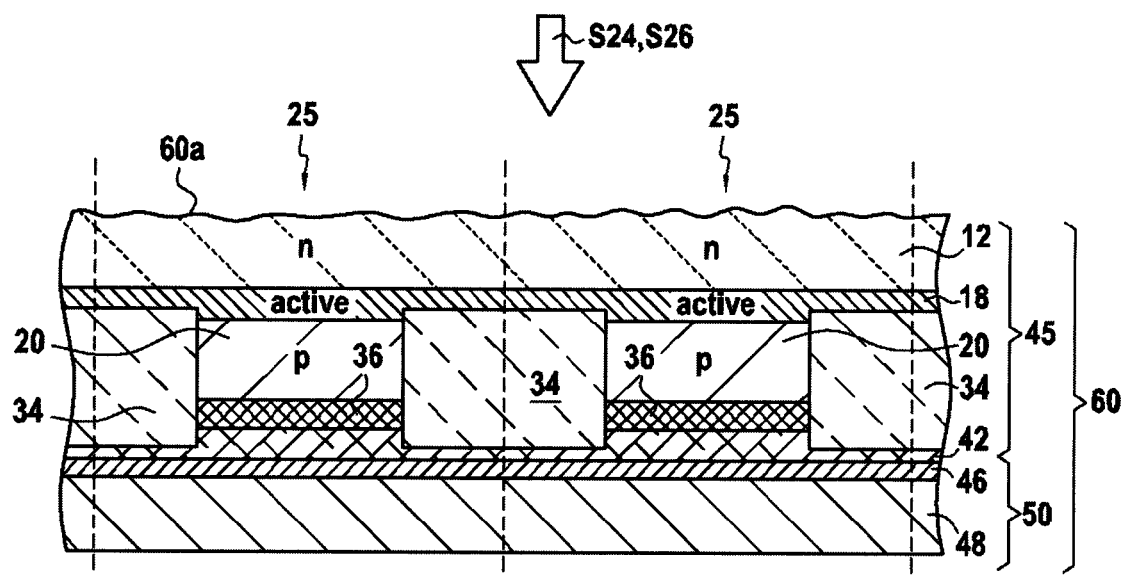
Figure 3:
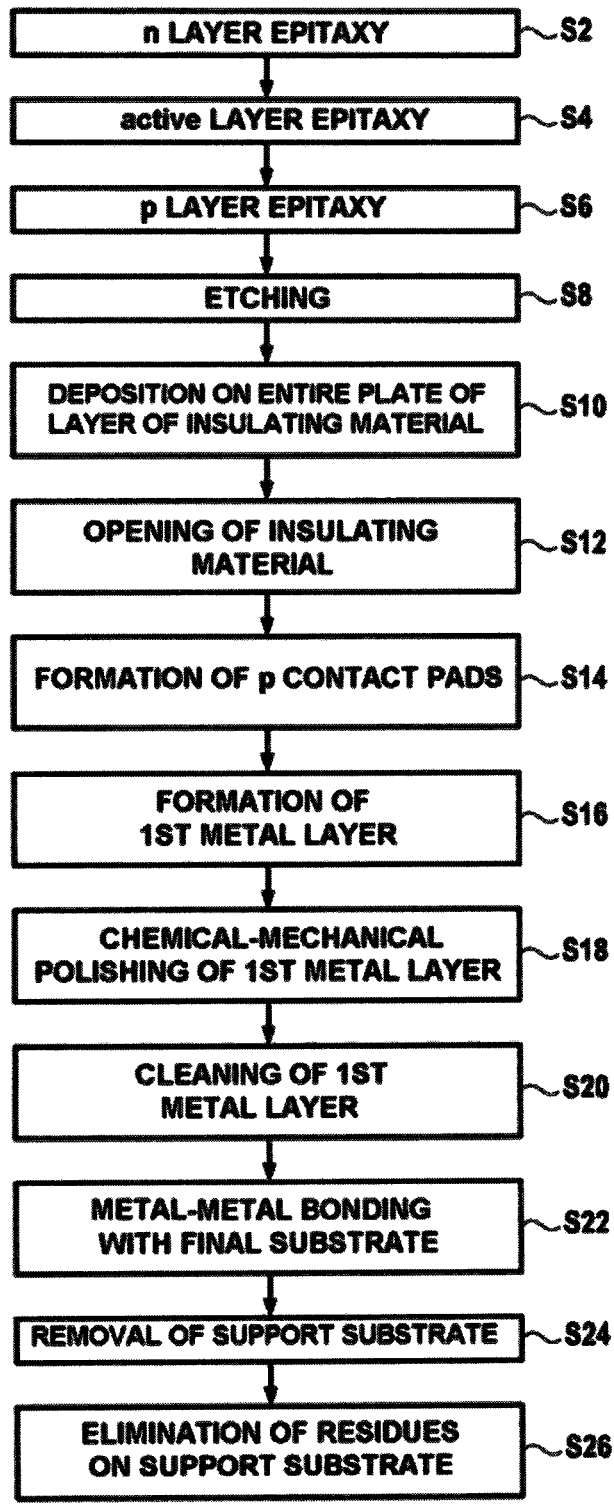
FIG. 3 is a flow diagram of the principal steps implemented in the first embodiment described in FIGS. 2A to 2I.

Once the cleaning step S20 is carried out, a transfer substrate (or receiver substrate) 50 is bonded on the upper surface 42a of structure 45, in order to obtain a new structure 52 (step S22, FIG. 2H).

The transfer substrate 50 can be semiconductor material (silicon, for example) or metal (molybdenum, tungsten, etc.).

In this example, the transfer substrate 50 comprises, on its bonding surface 50a, a metal layer 46 that is brought into contact with metal layer 42 during the bonding step S22.

Metal layer 42 can be composed of at least one among the following elements: Cu, Al, Ti and W.

It will also be noted that metal layers 42 and 46 can be of the same composition or of different compositions as the case may be.

According to one variant, the transfer substrate 50 consists of a single metal plate (e.g., a plate of copper, tungsten, etc.). In this case, one surface of the body of the transfer substrate 50 is brought directly into contact with the metal layer 42 during the bonding step S22.

As for surface 42*a*, the bonding surface 50*a* of the transfer substrate 50 is planar in order to be able to carry out bonding with the structure 45 under favorable conditions. As explained below, the roughness required for the bonding surface 50*a* can nevertheless vary somewhat according to the bonding technique employed during the assembly step S22.

In a first variant, assembly of the structure 45 on the transfer substrate 50 is carried out by bonding the metal layers 42 and 46 by molecular adhesion (at room temperature (between 20° C. and 30° C., for example). For the bonding by molecular adhesion to be carried out under favorable conditions, it is necessary that the roughness of the bonding surfaces 42*a* and 50*a* of the metal layers 42 and 46 is less than 1 nm RMS, and preferably less than or equal to 0.5 nm RMS. The step S18 of polishing of metal layer 42 must thus be configured in such a way as to achieve such a roughness. Moreover, a polishing step (CMP, for example) can be carried out on the bonding surface 50*a* of the transfer substrate 50 before bonding with the structure 45. The required roughness can, however, be achieved without such a polishing of the transfer substrate 50 being necessary: this can be the case, for example, when the metal layer 46 is a very thin layer (5 nm, for example) or the transfer substrate 50 is completely metallic.

As is well-known in its own right, the principle of bonding by molecular adhesion, also called direct bonding, is based on the bringing of two surfaces (here, surfaces 42*a* and 50*a*) into direct contact, i.e., without the use of a specific bonding material (adhesive, wax, solder, etc.). Such an operation requires that the surfaces to be bonded are sufficiently smooth and free of particles or contamination and that they are brought sufficiently close to make it possible to initiate contact, typically at a distance of less than a few nanometers. In this case, the attractive forces between the two surfaces are great enough to cause molecular adhesion (bonding induced by the sum of the attractive forces (van der Waals forces) of the electron interactions between the atoms or molecules of the two surfaces to be bonded).

Bonding by molecular adhesion can be initiated by the application of a pressure point on at least one position of the structure 45 and/or the transfer substrate 50 (preferably on the periphery of the plate). The bonding wave between these two plates is then propagated from the point where pressure was applied. The application of such a pressure is not, however, obligatory to initiate the propagation of the bonding wave.

After bonding by molecular adhesion, annealing can be carried out at a moderate temperature (preferably less than or equal to 100° C.) in order to strengthen the bonding of the structure 45 on the transfer substrate 50.

According to a second variant, the bonding in step S22 is carried out by compression at room temperature. This technique makes it possible to obtain the bonding of structure 45 on transfer substrate 50 notably when the roughness of surfaces 42*a* and/or 50*a* are greater (typically between 0.5 and 5 nm RMS) and, in particular, when surfaces 42*a* and 50*a* are not sufficiently planar to allow bonding by molecular adhesion.

According to a third variant, the bonding in step S22 is carried out by compression at a temperature less than or equal to 100° C. This moderate rise in temperature can be carried out in order to facilitate the bonding of structure 45 on transfer substrate 50. The temperature applied during compression bonding is a function of the materials of substrates 10 and 50 and, more particularly, a function of the CTE of the two substrates 10 and 50. The chosen temperature must indeed be such that the risks of fractures due to a CTE mismatch are minimal.

The transfer substrate 50 must preferably make it possible to ensure good mechanical support for the final LED devices, as well as access to the p contact pads 36. In this example, the transfer substrate 50 comprises from the side of its bonding surface 50*a* copper contact pads (not shown) insulated from each other by portions of insulating material, these portions being SiN, for example. Each of these contact pads is formed at a location in alignment with at least part of a p contact pad 36. Access to the contact pads of transfer substrate 50 located on surface 50*a* is, for example, ensured by vertical electronic connections (not shown), also called "vias," crossing the thickness of transfer substrate 50 to its opposite surface 50*b*.

The transfer substrate 50 can be composed notably of alumina or polycrystalline AlN, good thermal conductors, or of silicon.

Once the transfer substrate 50 and the structure 45 are assembled, the support substrate 10 is removed, for example, by the well-known technique of laser lift-off, notably in the case of a sapphire substrate, or by chemical etching (step S24, FIG. 2I).

In the case of removal by laser lift-off or another nondestructive technique, the support substrate 10 can be reused.

One obtains, at this stage of the process, a structure 60 from which LED devices, each formed of one or several elemental structures 25 wired and equipped with a substrate provided with at least p connections, can be cut out.

It should be noted that surface 60*a* of LEDs structure 60 can be etched in order to remove any residues remaining from support substrate 10 and can be structured to increase the extraction of light therefrom (step S26, FIG. 2I). Notably, the etching can be carried out by reactive plasma etching (chlorinated or fluorinated) or by UV-assisted chemical (PEC) etching.

In the example described here, it is then possible to form on the front surface 60*a* n contact pads on n-type layer 12. The formation of these n contact pads can be carried out collectively on the whole of the plate before the cutting step (in order to wire all the LED structures at the same time) or, alternatively, these pads can be prepared independently for each LED device once the cutting step is carried out.

In the case of the formation of white-light LED devices, a layer of luminophoric material capable of converting the light emitted by the devices into white light can also be deposited on surface 60*a* of LEDs structure 60, for example, by applying a liquid phosphorus-based composition on surface 60*a* followed by annealing to evaporate the dispersion solvent (spin-on glass).

Moreover, the LED devices can be provided with microstructures such as Fresnel lenses, for example, by nano- or micro-printing microstructures on the surface 60*a* of the structure 60.

Furthermore, a cutting step makes it possible to separate the LED structures present in the structure 60 at the conclusion of the manufacturing process.

The inventive manufacturing method advantageously makes it possible to be freed from the mechanical stresses resulting from the pressure and temperature conditions required for bonding by traditional thermocompression (as indicated above). The choice of material to use to form the support substrate and the transfer substrate is thus considerably expanded since strict CTE compatibility with the elemental LED structure is no longer required. It thus becomes possible to choose, for example, any material to form the support substrate: it can, for example, be a substrate of silicon (widely available and relatively economical in large volumes) or of metal (molybdenum, etc.).

It is particularly advantageous to carry out the assembly of the support substrate and the transfer substrate at room temperature, preferably by bonding by molecular adhesion. This type of bonding makes it possible to limit the mechanical stresses applied to the substrates during bonding and to avoid any thermal expansion that could then lead to deformations. The choice of materials that can form the substrates is thus greatly expanded.

FIGS. 4A to 4I and 5 represent the manufacture of LED devices in accordance with a second embodiment of the disclosure.

This second embodiment is on the whole very similar to the first embodiment described above in reference to FIGS. 2A-2I and 3.

This second embodiment differs from the first in that the elemental LED structures (here noted 125) are formed on a composite growth substrate 100, the latter comprising a support substrate 110, a buried layer 102 and growth islands 104 (FIGS. 2A and 2B).

The support substrate (here 110) consists of sapphire. Substrate 110 can also be composed of a semiconductor material, notably, such as silicon, silicon carbide or germanium. The buried layer 102 is an adaptation layer prepared here in $SiO_2$. The growth islands 104 are obtained from a growth layer of relaxed material, here a layer of InGaN prepared, for example, by epitaxial growth on a seed layer of GaN and then transferred onto the support substrate 110 via the buried layer 102.

Trenches 119 were here prepared in the growth layer so as to delimit the InGaN growth islands 104. The trenches 119 also make it possible to reduce the InGaN surface to be relaxed. The relaxation of the InGaN layer is carried out in advance of the inventive manufacturing method by means, for example, of an annealing of a slightly viscous layer (e.g., borophosilicate glass (BPSG)) disposed beforehand under the InGaN (not shown).

The elemental LED structures 125 are formed by successively depositing by epitaxy on the growth islands 104 an n-type layer 112, an active layer 118 and a p-type layer 120 (steps S102, S104 and S106, respectively) according to the same conditions as during the respective steps S2, S4 and S6 described above in the first embodiment.

This second embodiment differs from the first described above in that the trenches 119 are disposed in order to completely separate the elemental structures 125 from each other (i.e., the n-type layer 112 and the active layer 118 of an elemental structure 125 are not common to the other elemental structures 125).

The next steps S110, S112, S114, S116, S118, S120, S122, S124 and S126 are carried out according to the same conditions as steps S10, S12, S14, S16, S18, S20, S22, S24 and S26 described above and, thus, they will not be described again for reasons of simplicity.

Elements 130, 132, 134, 136, 138, 140, 142, 145, 146, 150, 152 and 160 notably correspond to elements 30, 32, 34, 36, 38, 40, 42, 45, 46, 50, 52 and 60, respectively, described above and were prepared according to the same conditions.

Figure 4A:
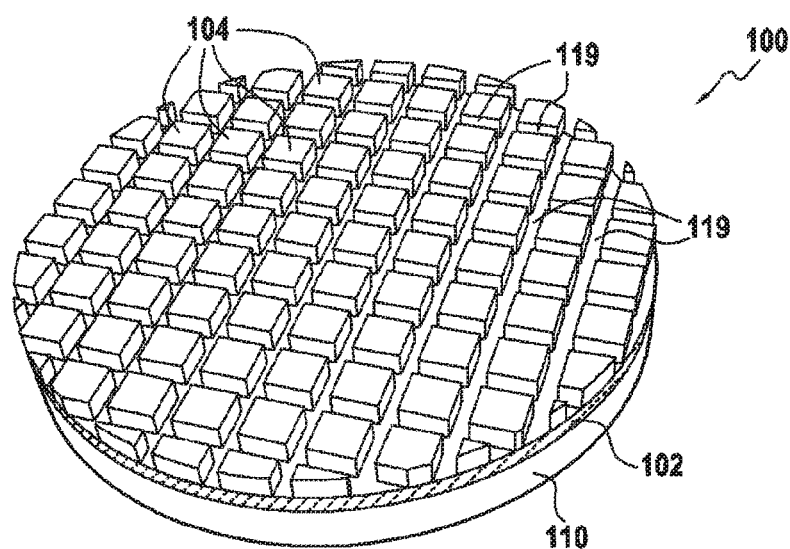
FIGS. 4A to 4I are schematic perspective and cross-sectional views showing the manufacture of LED devices in accordance with a second embodiment of the disclosure.
Figure 4B:
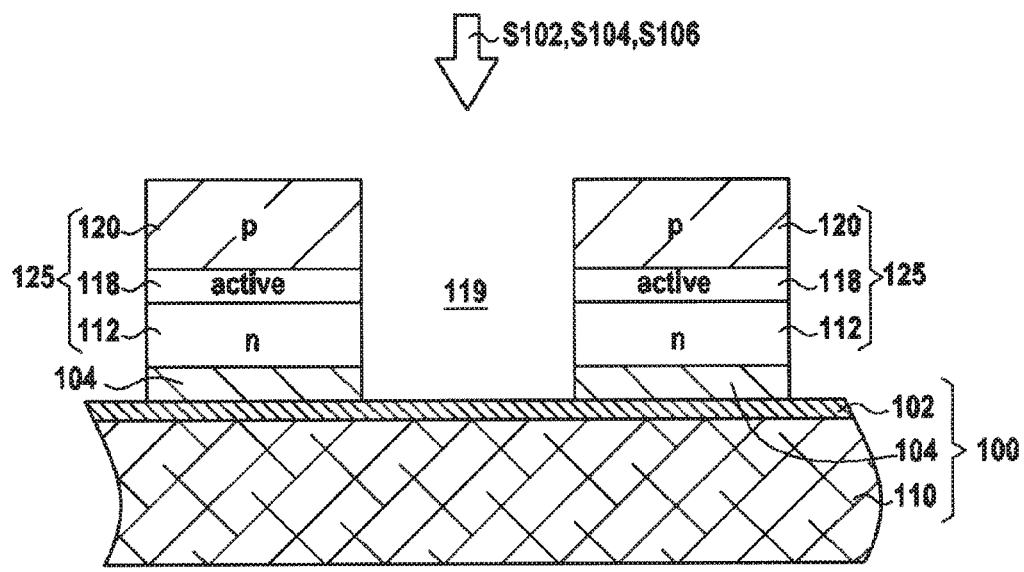
Figure 4C:
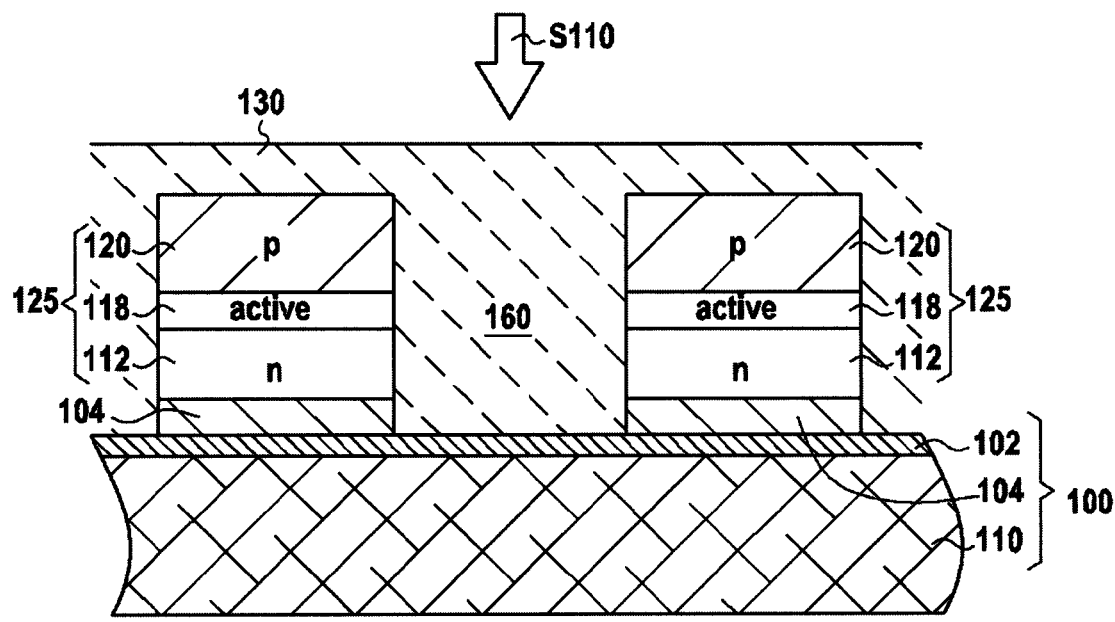
Figure 4D:
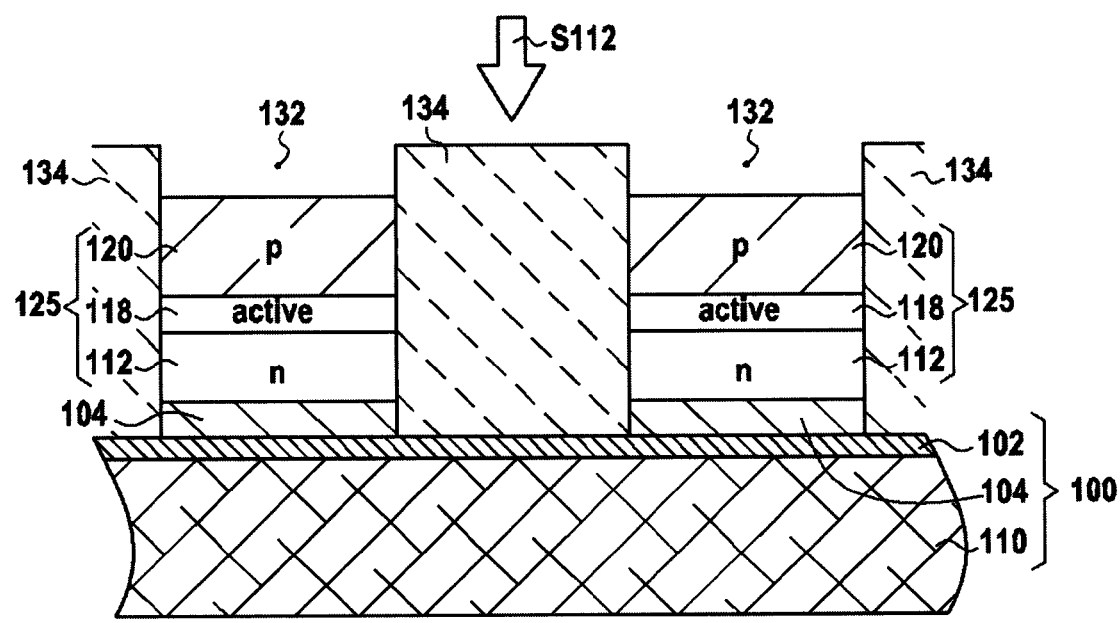
Figure 4E:
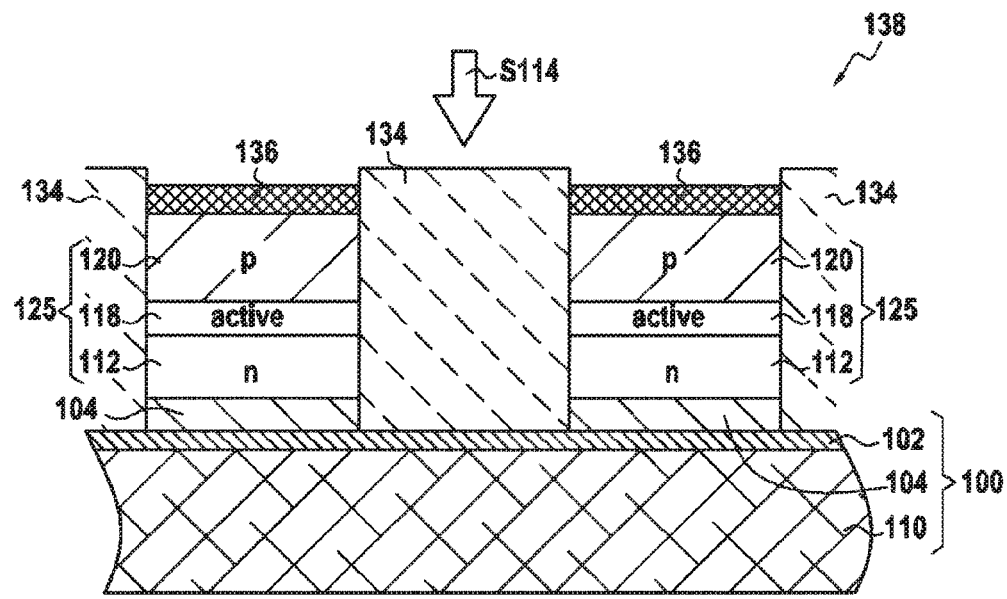
Figure 4F:
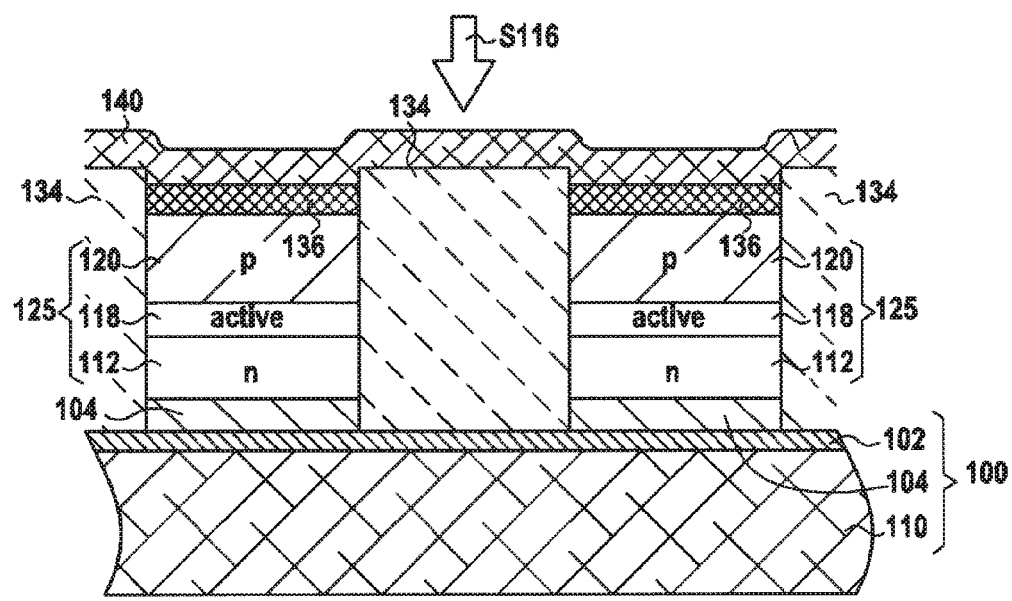
Figure 4G:
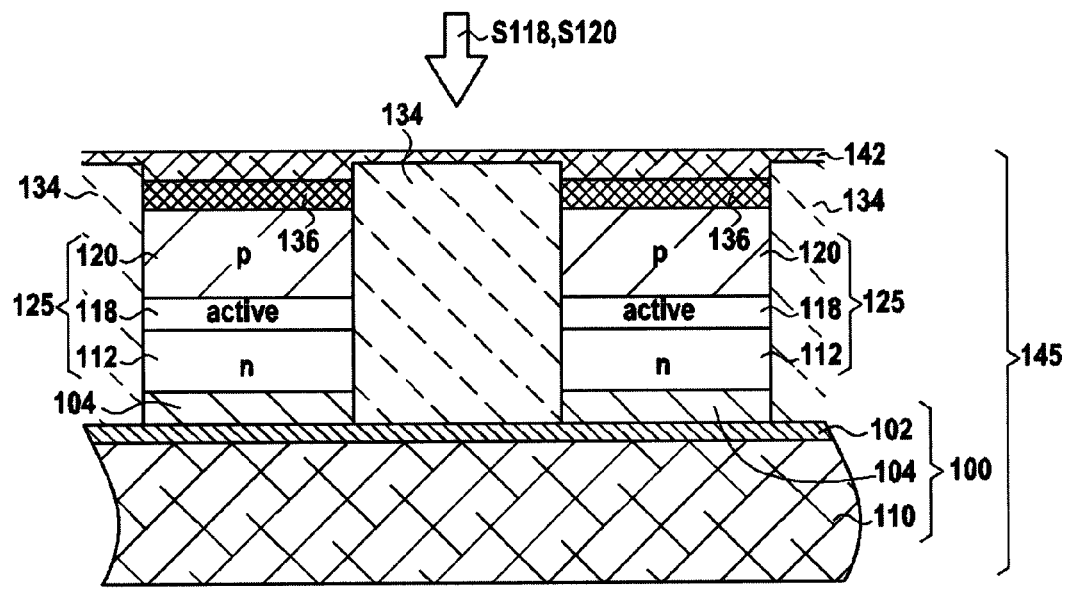
Figure 4H:
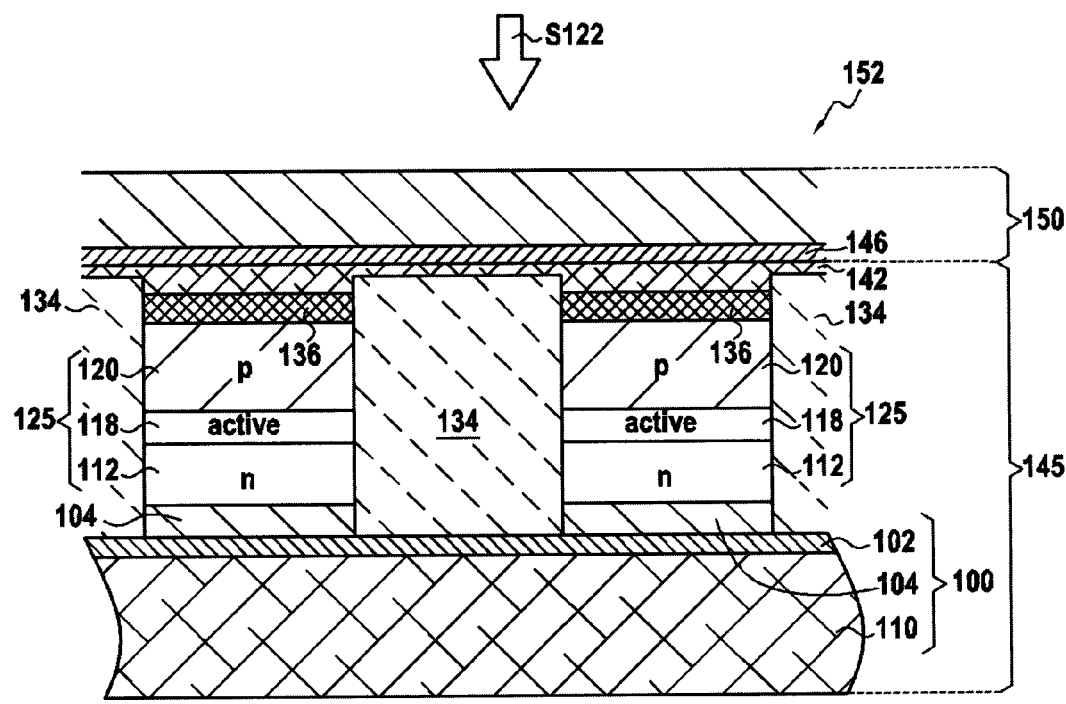
Figure 4I:
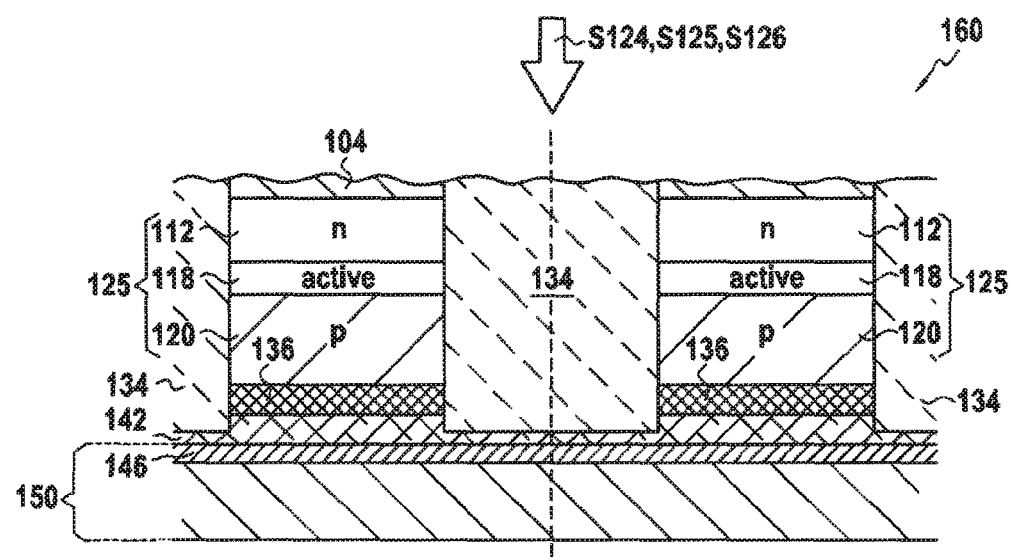
Figure 5:
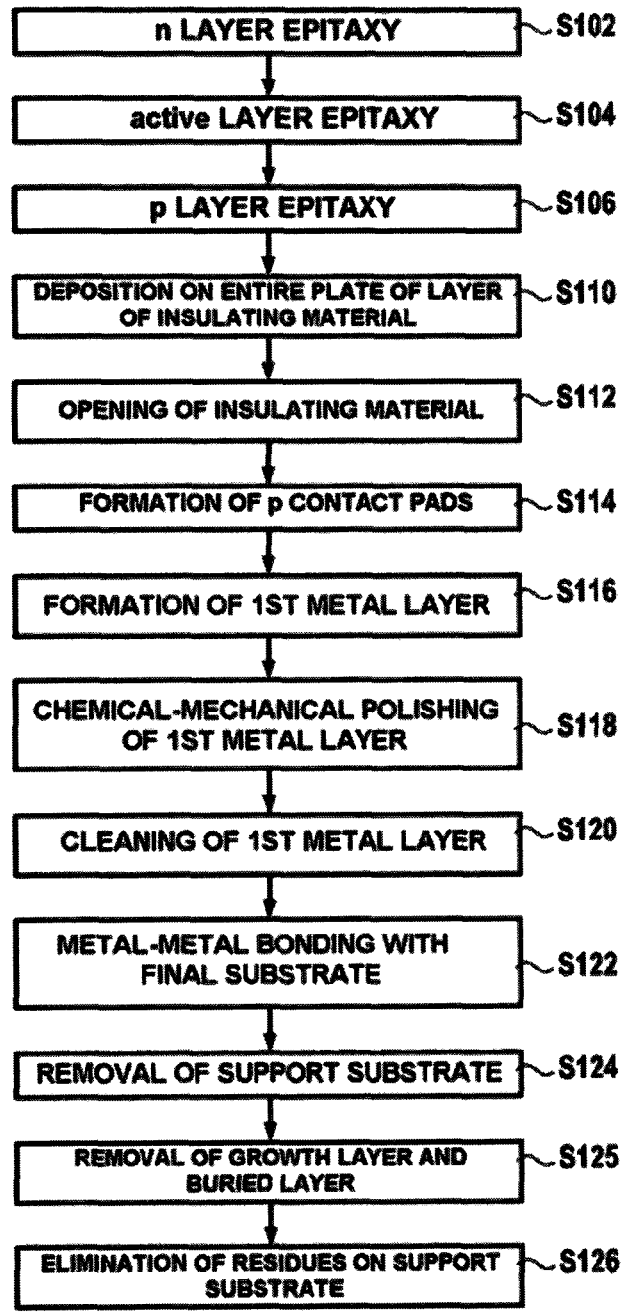
FIG. 5 is a flow diagram of the principal steps implemented in the second embodiment described in FIGS. 4A to 4I.

The second embodiment also differs from the first embodiment described above in that it comprises, after the removal S124 of the support substrate 110, the elimination S125 of the buried layer 102 and then of the growth islands 104, for example, by chemical etching (FIG. 4I).

The buried layer 102 of $SiO_2$ makes it possible here to facilitate the disassembly of the support substrate 110.

Once step S125 is carried out, it is possible to remove any residues from the support substrate 110, the buried layer 102 and the growth islands 104 in the same manner as in the elimination step S25 of the first embodiment.

The advantages described above concerning the first embodiment also apply to this second embodiment.

The invention claimed is:

1. A manufacturing method, comprising:
    a) forming a plurality of LED or photovoltaic elemental structures on a first substrate, each of the LED or photovoltaic elemental structures comprising at least one p-type layer, an active zone and an n-type layer;
    b) forming a planar first metal layer on the elemental structures;
    c) providing a transfer substrate comprising a planar second metal layer on a surface of the transfer substrate;
    d) assembling the elemental structures with the transfer substrate by bonding of the first metal layer and the second metal layer, the bonding being carried out by molecular adhesion at room temperature; and
    e) removing the first substrate; and
    wherein the elemental structures on the first substrate are spaced apart from each other by trenches;
    wherein the manufacturing method further comprises depositing an insulating material in the trenches present between the elemental structures between step a) and step b); and
    wherein step a) further comprises forming each of the elemental structures on an island of relaxed or partially relaxed material.

2. The manufacturing method of claim 1, wherein the relaxed or partially relaxed material is InGaN.

3. The manufacturing method of claim 2, further comprising, before step b), forming a p- or n-type electrical contact pad on an exposed surface of each of the elemental structures.

4. The manufacturing method of claim 3, wherein step b) further comprises polishing a surface of the first metal layer so as to obtain a surface roughness less than or equal to 1 nm RMS, and wherein step c) further comprises polishing a surface of the second metal layer so as to obtain a surface roughness less than or equal to 1 nm RMS.

5. The manufacturing method of claim 4, further comprising, between steps d) and e), an annealing step at a temperature less than or equal to 100° C.

6. The manufacturing method of claim 5, wherein each of the first metal layer and the second metal layer comprises a material selected from the group consisting of Cu, Al, Ti and W.

7. The manufacturing method of claim 1, wherein the elemental structures formed in step a) are photovoltaic structures each comprising at least one p-n junction.

8. The manufacturing method of claim 1, wherein the elemental structures formed in step a) are LED structures wherein said active zone is a light-emitting layer.

9. The manufacturing method of claim 1, further comprising, after step e), cutting the transfer substrate and separating the elemental structures.

10. The manufacturing method of claim 1, further comprising, before step b), forming a p- or n-type electrical contact pad on an exposed surface of each of the elemental structures.

11. The manufacturing method of claim 1, steps b) and c) each comprising a sub-step of respective polishing of said first and second metal layers so as to obtain a surface roughness less than or equal to 1 nm RMS.

12. The manufacturing method of claim 1, wherein step b) further comprises polishing a surface of the first metal layer so as to obtain a surface roughness less than or equal to 1 nm RMS, and wherein step c) further comprises polishing a surface of the second metal layer so as to obtain a surface roughness less than or equal to 1 nm RMS.

13. The manufacturing method of claim 12, further comprising, between steps d) and e), an annealing step at a temperature less than or equal to 100° C.

14. The manufacturing method of claim 1, wherein each of the first metal layer and the second metal layer comprises a material selected from the group consisting of Cu, Al, Ti and W.

\* \* \* \* \*